(12) United States Patent
Hosokawa (10) Patent No.: US 6,448,555 B1
(45) Date of Patent: Sep. 10, 2002

(54) ELECTRON MICROSCOPE AND SIMILAR INSTRUMENTS

(75) Inventor: Fumio Hosokawa, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 09/362,756

(22) Filed: Jul. 28, 1999

(51) Int. Cl.$^7$ ................................................. H01J 37/26
(52) U.S. Cl. ...................................... 250/310; 250/311
(58) Field of Search ................................. 250/310, 311, 250/307, 306

(56) References Cited

U.S. PATENT DOCUMENTS

| | | | |
|---|---|---|---|
| 3,209,146 A | * 9/1965 | Shogo Shirai | 250/49.5 |
| 4,048,498 A | * 9/1977 | Gerlach et al. | 250/305 |
| 4,698,502 A | * 10/1987 | Bednorz et al. | 250/306 |
| 4,803,358 A | * 2/1989 | Kato et al. | 250/310 |
| 6,039,000 A | * 3/2000 | Libby et al. | 118/723 E |
| 6,051,834 A | * 4/2000 | Kakibayashi et al. | 250/311 |
| 6,067,164 A | * 5/2000 | Onoguchi et al. | 356/401 |
| 6,114,695 A | * 9/2000 | Todokoro et al. | 250/310 |

OTHER PUBLICATIONS

"Development of a Specimen Drift Correction System Using a Personal Computer and Piezo Devices", Y. Kondo et al., ICEM 13—Paris, Jul. 17–22, 1994, pp. 275–276.

* cited by examiner

*Primary Examiner*—Kiet T. Nguyen
(74) *Attorney, Agent, or Firm*—Webb Ziesenheim Logsdon Orkin & Hanson, P.C.

(57) ABSTRACT

There is disclosed a TEM (transmission electron microscope)/SEM (scanning electron microscope) instrument capable of x-ray mapping with automated correction of specimen drift. In x-ray mapping, an SE (secondary electron) image of a scanned region on a specimen is stored as a reference image in memory in the first scan. After a given number of scans are made, an SE image is derived and subject to comparison. The cross-correlation function between each image to be compared and the reference image is calculated to find the direction and amount of the deviation of each image from the reference image. The electron beam deflection system is so controlled as to cancel the deviation, thus correcting the specimen drift. Whenever a given number of scans are made, the correction of the specimen drift is performed.

7 Claims, 5 Drawing Sheets

ELECTRON MICROSCOPE AND SIMILAR INSTRUMENTS

FIELD OF THE INVENTION

The present invention relates to a transmission electron microscope (TEM) for directing a focused electron beam at a desired region on a surface of a specimen while scanning the beam in two dimensions, detecting x-rays, Auger electrons, and other signals emanating from the region, and deriving a two-dimensional image based on the detected signals. The invention also relates to a scanning electron microscope (SEM) and instruments designed similarly to the transmission electron microscope described above.

DESCRIPTION OF THE PRIOR ART

A transmission electron microscope (TEM) is known as an instrument for directing an electron beam at the specimen and imaging the specimen at a high magnification by making use of electrons transmitted through the specimen. In recent years, TEMs equipped with an electron beam-scanning device, a secondary electron detector, a transmission electron detector, or an x-ray spectrometer in addition to the intrinsic functions of the TEM as described above, have been developed. On the other hand, a scanning electron microscope (SEM) is known as an instrument that directs an electron beam at a specimen while scanning the beam, detects secondary electrons produced from the specimen, and creates a magnified image of the specimen surface. Some developed SEMs are fitted with x-ray spectrometers. Various kinds of x-ray spectrometers are available. In the description given below, it is assumed that an energy-dispersive x-ray spectrometer (EDS) is mainly used. The EDS consists of an x-ray detector (hereinafter referred to as the "EDS detector") and an x-ray analysis processor.

With this TEM, a desired region on a specimen is scanned with an electron beam, and electrons transmitted through the specimen are detected. Thus, an STEM (scanning transmission electron microscopy) image is obtained. Also, a secondary electron image (SE image) can be derived by scanning a desired region on a specimen with an electron beam and detecting secondary electrons emitted from the specimen with a secondary electron detector. Furthermore, x-rays emanating from the specimen are detected and spectrally analyzed, and then an image representing the distribution of x-ray intensities is created. This is known as x-ray mapping. In SEM, a backscattered electron image can be formed by detecting backscattered electrons from the specimen, in addition to a secondary electron image. Of course, x-ray mapping can be performed.

X-ray mapping is a technique consisting of scanning a desired region on a specimen with an electron beam, detecting x-rays emitted from the specimen with an EDS detector, analyzing detected x-ray energies and count rates with an x-ray analysis processor, and displaying a two-dimensional image representing elements contained in each position of the scanned region and their concentrations. Normally, regions of the elements having different concentrations are represented in different colors. In this way, the results of the x-ray mapping are displayed on a monitor or printed out.

In x-ray mapping measurements, it is customary to scan a desired region on a specimen repeatedly and to accumulate the output signal from the x-ray spectrometer, for the following reason. Only a quite small amount of output signal is obtained from the x-ray spectrometer in one scan, i.e., a limited number of counts are derived. Therefore, an image with good contrast cannot be obtained because of statistical variations. For this reason, the scan is repeated, and the output signal from the x-ray spectrometer is accumulated. This increases the amount of signal (counted value), thus suppressing the statistical variations. This is especially important where x-ray mapping images are obtained in transmission electron microscopy (TEM) at a high magnification that needs a spatial resolution on the order of angstroms, and also where x-ray mapping measurements are performed in SEM at a high magnification requiring a submicron spatial resolution. In some cases, the electron beam needs to be scanned repeatedly for 2 to 3 hours.

Figure 2A:
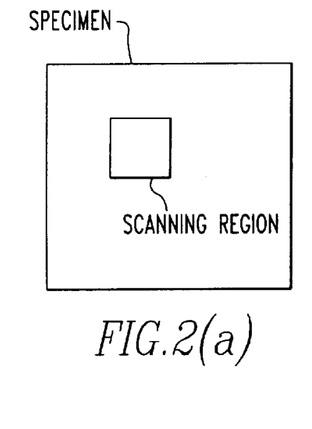
FIGS. 2(a) and 2(b) are diagrams illustrating a problem addressed by the present invention.
Figure 2B:
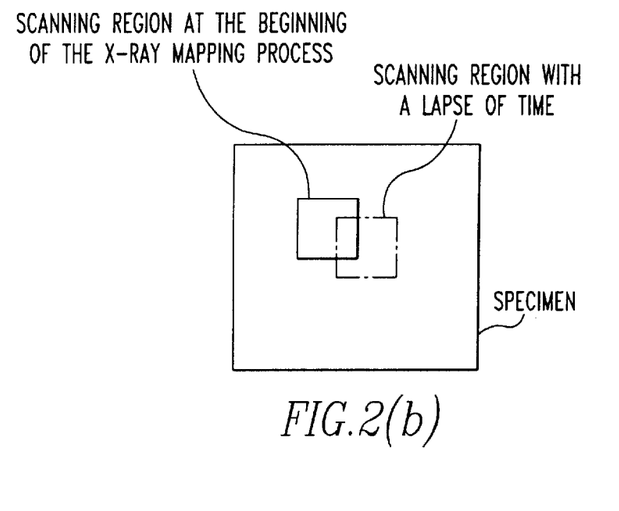

However, where the electron beam is scanned across a desired region on a specimen to perform the aforementioned x-ray mapping, the specimen position shifts. For example, if a region indicated by the solid line in FIG. 2($a$) is scanned at the beginning of an x-ray mapping process, a shifted region indicated by the broken line shown in FIG. 2($b$) is scanned with a lapse of time. This phenomenon is referred to as specimen drift and caused in TEM for the following causes. The specimen stage holding the specimen is irradiated with the electron beam to thereby give rise to thermal diffusion, thus producing thermal expansion. Where the external temperature varies, the specimen stage expands or contracts. The position on the specimen hit by the electron beam may drift for the other reasons, that is, the external temperature or the charging along the electron path causes the electron column to vary its irradiating position. This is referred to as beam drift.

Where the scanned region shifts or drifts due to the specimen drift or beam drift, the spatial resolution of the image deteriorates. In this way, the specimen drift and beam drift are undesirable.

Accordingly, the operator has adopted the following procedure. After the scan is made for a given period, the operator halts the x-ray mapping process, and an SE image is once obtained. This SE image is compared with an SE image produced at the beginning of the x-ray mapping process. The operator then judges the direction in which the later obtained image has shifted with respect to the first image, as well as the amount of the shift. The operator manually controls the deflection system for the electron beam so that the scanned region moves the found distance in the found direction. The x-ray mapping process is then resumed. In this way, a quite cumbersome sequence of operations must be performed, thus deteriorating the efficiency of the work.

SUMMARY OF THE INVENTION

Accordingly, it is an object of the present invention to provide an electron microscope and similar instrument capable of automatically correcting specimen drift and beam drift during an x-ray mapping process, whereby permitting the x-ray mapping process to be conducted continuously for a long time without deteriorating the spatial resolution.

In an electron microscope and similar instruments that achieve the above-described object in accordance with the teachings of the invention, a focused electron beam is directed at a desired region on a specimen while scanning the beam in two dimensions, and a desired first signal from the region is detected. A first two-dimensional image is obtained from this first signal. The scan is repeated, and the first signal is accumulated to perform a sequence of measurements for obtaining the first two-dimensional image. At the beginning of the sequence of measurements, a second two-dimensional image is obtained from a second signal derived from the desired region, the second signal being different from the first signal. The second two-dimensional image is used as a reference image. As the measurement process progresses, two-dimensional images are successively obtained and compared with the reference image. Directions and amounts of deviations of these images from the reference image are found. Means are provided to modify the region scanned with the electron beam according to the found directions and amounts.

Other objects and features of the invention will appear in the course of the description thereof, which follows.

DETAILED DESCRIPTION OF THE INVENTION

Figure 1:
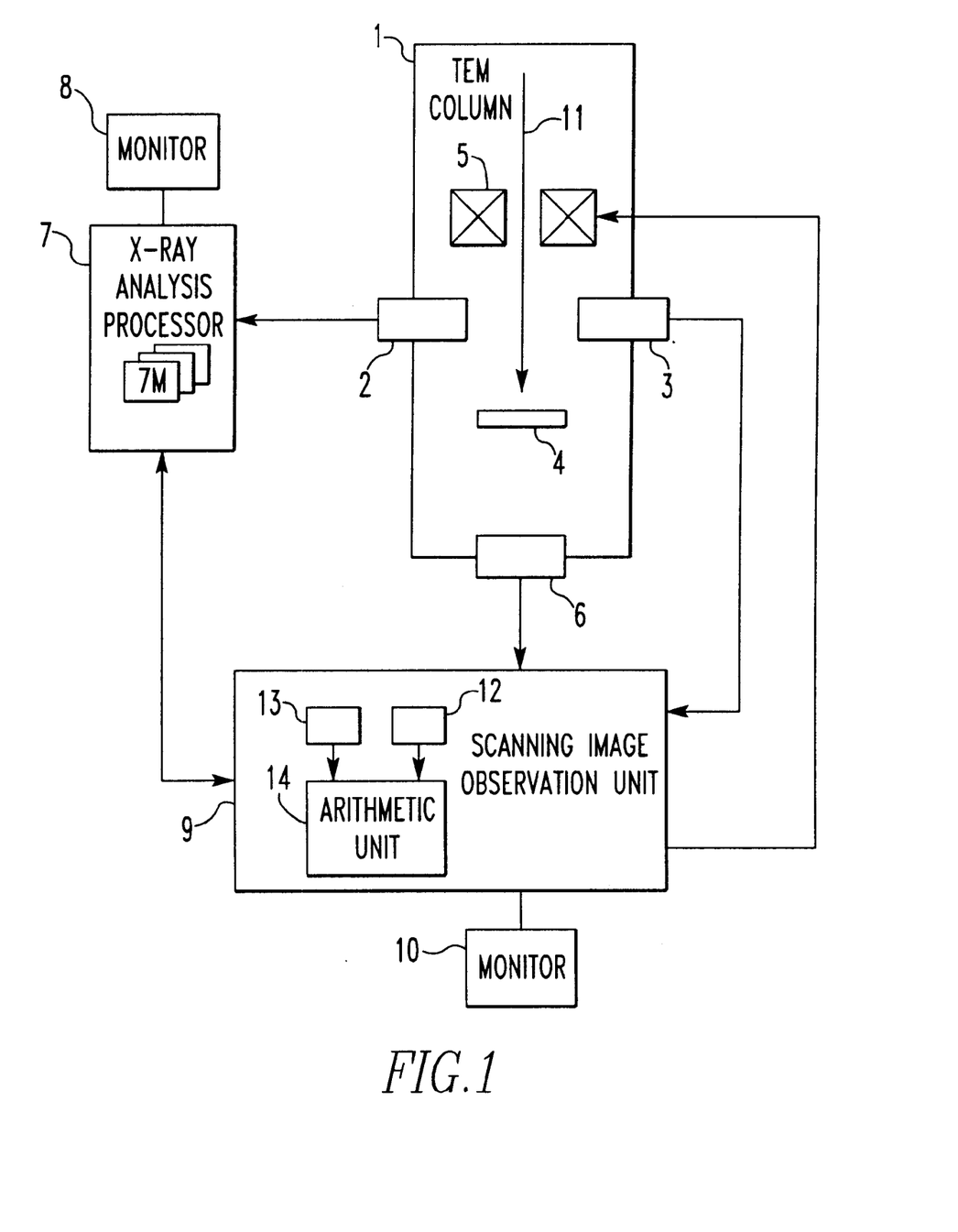
FIG. 1 is a block diagram of a transmission electron microscope in accordance with the present invention.

Referring to FIG. 1, there is shown a transmission electron microscope (TEM) embodying the concept of the present invention. This microscope has a microscope column 1, an ESD detector 2, a secondary electron detector 3, an electron beam deflection system 5, a transmission electron detector 6 for producing an STEM image, an x-ray analysis processor 7, a monitor 8 ancillary to the x-ray analysis processor 7, a scanning image observation unit 9, and a monitor 10 ancillary to the observation unit 9. A specimen 4 is placed within the TEM microscope column 1.

Indicated by 11 is an electron beam. The x-ray analysis processor 7 includes memories 7M for accumulating and storing x-ray mapping images. The number of the memories 7M is equal to the number of elements measured simultaneously. Data about a reference image is stored in another memory 12. Data about images to be compared with the reference image is stored in a further memory 13. The memories 12 and 13 are connected with an arithmetic unit 14.

Mounted inside the microscope column 1 are the EDS detector 2, the secondary electron detector 3, and the deflection system 5. The specimen 4 is also placed within the microscope column 1. The STEM detector (transmission electron detector) 6 is mounted under the specimen 4 and made of a scintillator, a photomultiplier, a channel plate, or the like. Since they are well known in the art, the STEM detector 6 is not described in detail. Various other devices (not shown), such as an electron gun, accelerating electrodes, and a specimen stage on which the specimen 4 is placed, are mounted inside the microscope column 1.

The x-ray analysis processor 7 analyzes x-ray energies and count rates, based on a scanning signal supplied from the scanning image observation unit 9 and on an output signal from the EDS detector 2. The processor 7 carries out processing regarding x-ray mapping. For example, the x-ray analysis processor 7 consists of a personal computer. X-ray mapping images are accumulated in the memory 7M during measurements. X-ray mapping images obtained as a result of various kinds of processing concerning x-ray mapping are displayed on the monitor 8 or sent to the scanning image observation image 9, where the images are presented on the monitor 10.

The scanning image observation unit 9 includes a function of scanning the electron beam 11 by controlling the deflection system 5, a function of creating an SE image from the output signal from the secondary electron detector 3 and displaying the image on the monitor 10, a function of displaying an STEM image on the monitor 10 after accepting the STEM image from the transmission electron detector 6, a function of displaying an x-ray mapping image on the monitor 10, the x-ray mapping image being transmitted from the x-ray analysis processor 7, a function of storing a reference image (described later) and an image to be compared in the memories 12 and 13, respectively, and a function of calculating a cross-correlation function between these images by means of the arithmetic unit 14. The scanning image observation unit 9 can be made of a personal computer or the like and includes input devices, such as a keyboard and a mouse.

X-ray mapping is done in the manner described below. In this case, the operator first causes the scanning image observation unit 9 to display an SE image or STEM image of the specimen 4 on the monitor 10, establishes a region on the specimen 4 within which an x-ray mapping process is to be carried out, and gives an instruction for starting the x-ray mapping process. Where a region on the specimen 4 is established as described above or processing (described later) is performed, the image is an SE image or an STEM image, because such an image consists of a much larger amount of signal than x-rays used for x-ray mapping and gives sufficiently high contrast. In the description given below, it is assumed that only SE images are employed.

On recognizing an instruction for start of an x-ray mapping process, the scanning image observation unit 9 creates a scanning signal for scanning the established region on the specimen 4 and supplies the signal to the deflection system 5. The observation unit 9 instructs the x-ray analysis processor 7 to start an x-ray mapping process and supplies a scanning signal to the processor 7.

The electron beam 11 is started to scan the region established on the specimen 4. The x-ray analysis processor 7 accepts the output signal from the EDS detector 2 and initiates processing of x-ray mapping. In the first scan, the scanning image observation unit 9 accepts the output signal from the secondary electron detector 3, creates an SE (secondary electron) image, and stores it as a reference image in the memory 12.

When a given number of scans are complete, the scan image observation unit 9 accepts the output signal from the secondary electron detector 3 in the next scan, creates an SE image, and stores it as an image to be compared in the memory 13. This image stored in the memory 13 is compared with the reference image in the memory 12. The observation unit 9 causes the arithmetic unit 14 to calculate the direction and amount of deviation of the compared image from the reference image by a method, such as a well-known pattern matching procedure, that calculates the amount and direction of the deviation of one image from the other. In this embodiment, the pattern matching is done, using a cross-correlation function XCF(r) between the reference image and the image to be compared, the function being given by $$XCF(r)=FT^{-1}[FT[IMG1](FT[IMG2])^*] \qquad (1)$$

where IMG1 indicates the reference image, IMG2 indicates an image to be compared, FT[IMG1] indicates the Fourier transform of the reference image, (FT[IMG2]*) indicates the complex conjugate of the Fourier transform of the image to be compared, and $FT^{-1}$ indicates the inverse Fourier transform.

Calculation of Eq. (1) results in the distribution of similarity scores of the compared image with respect to the reference image, i.e., the distribution of positional deviations. Therefore, the direction and amount of the deviation of the compared image from the reference image can be found. In particular, the position of the peak appearing in the cross-correlation function XCF(r) gives the vector dr of movement of the compared image relative to the reference image. This vector of movement dr results in specimen drift.

The scanning image observation unit 9 finds the direction and amount of the deviation of the compared image from the reference image, using the vector of movement dr found from Eq. (1). The observation unit 9 generates a deflecting signal to cause the scanned region to move a distance equal to the found amount of deviation in the found direction. The deflecting signal is fed to the deflection system 5. Consequently, the electron beam 11 is deflected in the direction to cancel the vector of movement dr. It follows that the same region is scanned as the region scanned at the beginning of the x-ray mapping process. That is, the specimen drift is corrected. The processing for correcting the specimen drift as described thus far can be performed simultaneously with the processing for x-ray mapping in the x-ray analysis processor 7 without interrupting the latter processing, because both kinds of measurements can be carried out under the same irradiation conditions and same scanning conditions.

Whenever a given number of scans are complete, the scanning image observation unit 9 creates an image to be compared, calculates the cross-correlation function between the compared image and the reference image, finds the direction and amount of the deviation of the compared image from the reference image, and corrects the specimen drift based on the found direction and amount of the deviation, until the x-ray mapping process ends. In the description above, the corrective processing is effected whenever a given number of scans are made. Alternatively, the corrective processing may be performed every scan.

Figure 3:
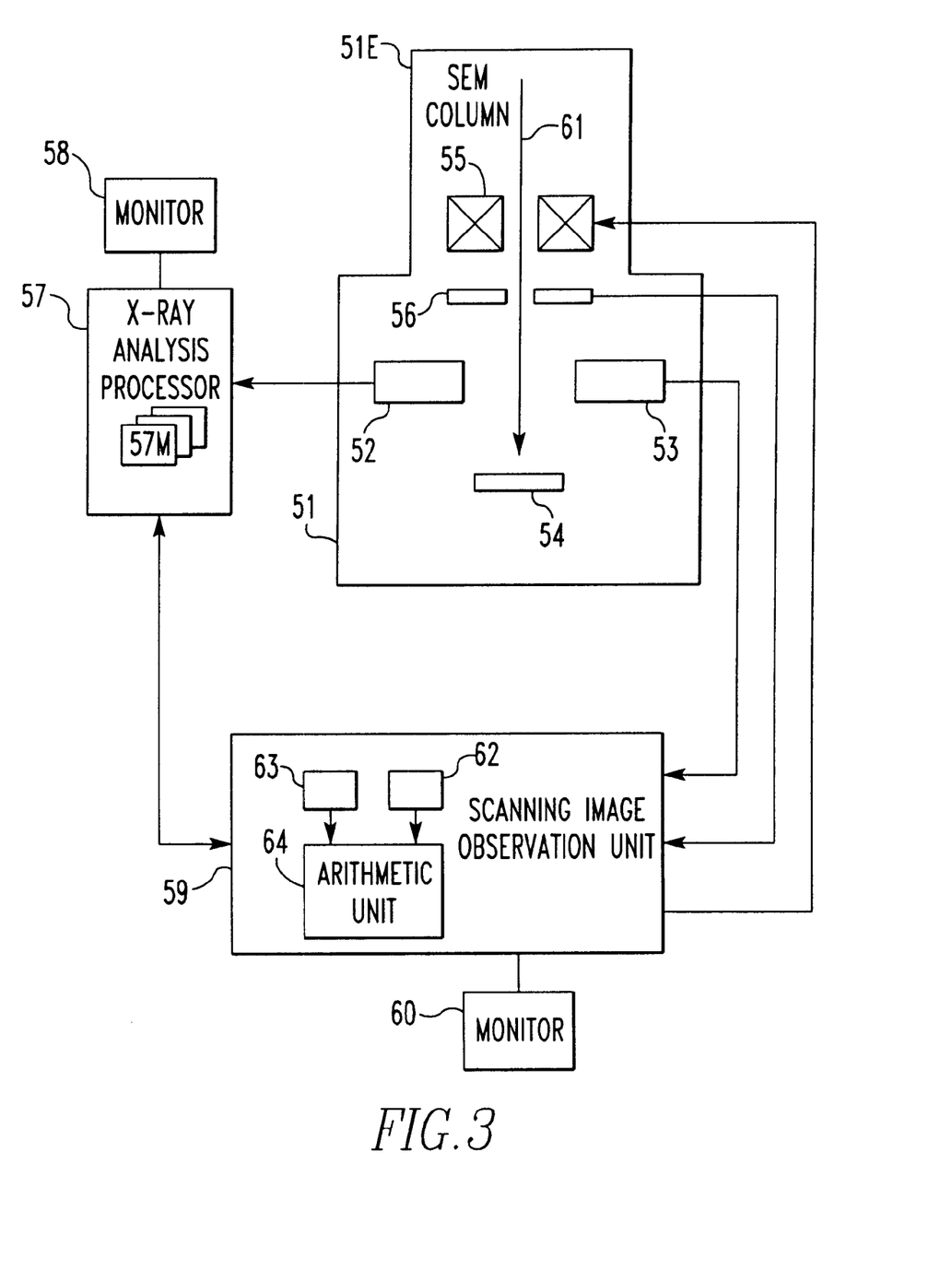
FIG. 3 is a block diagram of a scanning electron microscope in accordance with the present invention.

FIG. 3 shows a scanning electron microscope embodying the concept of the present invention. This instrument comprises a specimen chamber 51, a microscope column 51E, an EDS detector 52, a secondary electron detector 53, an electron beam deflection system 55, a backscattered electron detector 56, for example, of the annular type, an x-ray analysis processor 57, a monitor 58 ancillary to the x-ray analysis processor 57, a scanning image observation unit 59, and a monitor 60 ancillary to the observation unit 59. A specimen 54 is placed within the specimen chamber 51. An electron beam 61 is produced within the microscope column 51E. X-ray mapping images are accumulated and stored in memories 57M mounted in the processor 57. The number of the memories 57M is equal to the number of elements measured simultaneously. A reference image is stored in a memory 62. An image to be compared is stored in another memory 63. An arithmetic unit 64 is connected with these memories 62 and 63 within the observation unit 59.

The EDS detector 52, the secondary electron detector 53, the backscattered electron detector 56, and the specimen 54 are placed within the specimen chamber 51. The deflection system 55 is positioned in the microscope column 51E. In addition, a specimen stage (not shown) on which the specimen 54 is placed is located in the specimen chamber 51. An electron gun and other components (not shown) are mounted in the microscope column 51E.

The x-ray analysis processor 57 performs processing of x-ray mapping, based on a scanning signal supplied from the scanning image observation unit 59 and on the output signal from the EDS detector 52. For example, the processor 57 consists of a personal computer. X-ray mapping images are accumulated in the memory 57M during measurements. X-ray mapping images obtained as a result of various kinds of processing of x-ray mapping are displayed on the monitor 58. Alternatively, data is sent to the scanning image observation unit 59, and the images are displayed on the monitor 60.

The scanning image observation unit 59 includes a function of scanning the electron beam 61 by controlling the deflection system 55, a function of creating an SE image from the output signal from the secondary electron detector 53 and displaying the image on the monitor 60, a function of displaying a backscattered electron (BSE) image on the monitor 60 after accepting the BSE image from the backscattered electron detector 56, a function of displaying an x-ray mapping image on the monitor 60, the x-ray mapping image being transmitted from the x-ray analysis processor 57, a function of storing a reference image (described later) and an image to be compared in the memories 62 and 63, respectively, and a function of calculating a cross-correlation function between these images by means of the arithmetic unit 64. The scanning image observation unit 59 can be made of a personal computer or the like and includes input devices, such as a keyboard and a mouse.

X-ray mapping is done in the manner described below. In this case, the operator first causes the scanning image observation unit 59 to display an SE image or BSE (backscattered electron) image of the specimen 54 on the monitor 60, establishes a region on the specimen 54 within which an x-ray mapping process is to be carried out, and gives an instruction for starting the x-ray mapping process. Where a region on the specimen is established as described above or processing (described later) is performed, the image is an SE image or a BSE image, because such an image consists of a much larger amount of signal than x-rays used for x-ray mapping and gives sufficiently high contrast. In the description given below, it is assumed that only SE images are employed.

On recognizing the instruction for start of the x-ray mapping process, the scanning image observation unit 59 creates a scanning signal for scanning the established region on the specimen 54 and supplies the signal to the deflection system 55. The observation unit 59 instructs the x-ray analysis processor 57 to start an x-ray mapping process and supplies a scanning signal to the processor 57.

The electron beam 61 is started to scan the region established on the specimen 54. The x-ray analysis processor 57 accepts the output signal from the EDS detector 52 and initiates processing of x-ray mapping. In the first scan, the scanning image observation unit 59 accepts the output signal from the secondary electron detector 53, creates an SE image, and stores it as a reference image in the memory 62.

When a given number of scans are complete, the scanning image observation unit 59 accepts the output signal from the secondary electron detector 53 in the next scan, creates an SE image, and stores it as an image to be compared in the memory 63. This image stored in the memory 63 is compared with the reference image in the memory 62. The arithmetic unit 64 calculates the direction and amount of the deviation of the compared image from the reference image by a method similar to the method used in the case of TEM.

The scanning image observation unit 59 finds the direction and amount of the deviation of the compared image from the reference image, using the obtained vector of movement dr. The observation unit 59 generates a deflecting signal to cause the scanned region to move a distance equal to the found amount of deviation in the found direction. The deflecting signal is fed to the deflection system 55. Consequently, the electron beam 61 is deflected in the direction to cancel the vector of movement dr. It follows that the same region is scanned as the region scanned at the beginning of the x-ray mapping process. That is, the specimen drift is corrected.

Whenever a given number of scans are complete, the scanning image observation unit 59 creates an image to be compared, calculates a cross-correlation function between the compared image and the reference image, finds the direction and amount of the deviation of the compared image from the reference image, and corrects the specimen drift based on the found direction and amount of the deviation, until the x-ray mapping process ends.

Examples of apparatus similar to the scanning electron microscope in accordance with the present invention include an electron probe microanalyzer (EPMA) and a scanning Auger microprobe (SAM).

The electron probe microanalyzer (EPMA) produces x-rays by electron beam irradiation, spectrally separates the produced x-rays by an analyzer crystal, detects the x-rays by an x-ray detector, and makes a qualitative or quantitative analysis of a microscopic region on a specimen. X-ray mapping is also possible.

A scanning Auger microprobe (SAM) produces Auger electrons by electron beam irradiation, spectrally separates the Auger electrons by an electron analyzer, such as a cylindrical mirror analyzer (CMA) or a hemispherical electrostatic analyzer (HSA), detects the Auger electrons by an electron detector, such as a multi-channel detector or the like, and makes an elemental analysis of a near-surface region of the specimen. Furthermore, Auger electron mapping is possible in which the distribution of intensities of Auger electrons is displayed in two dimensions.

Figure 4:
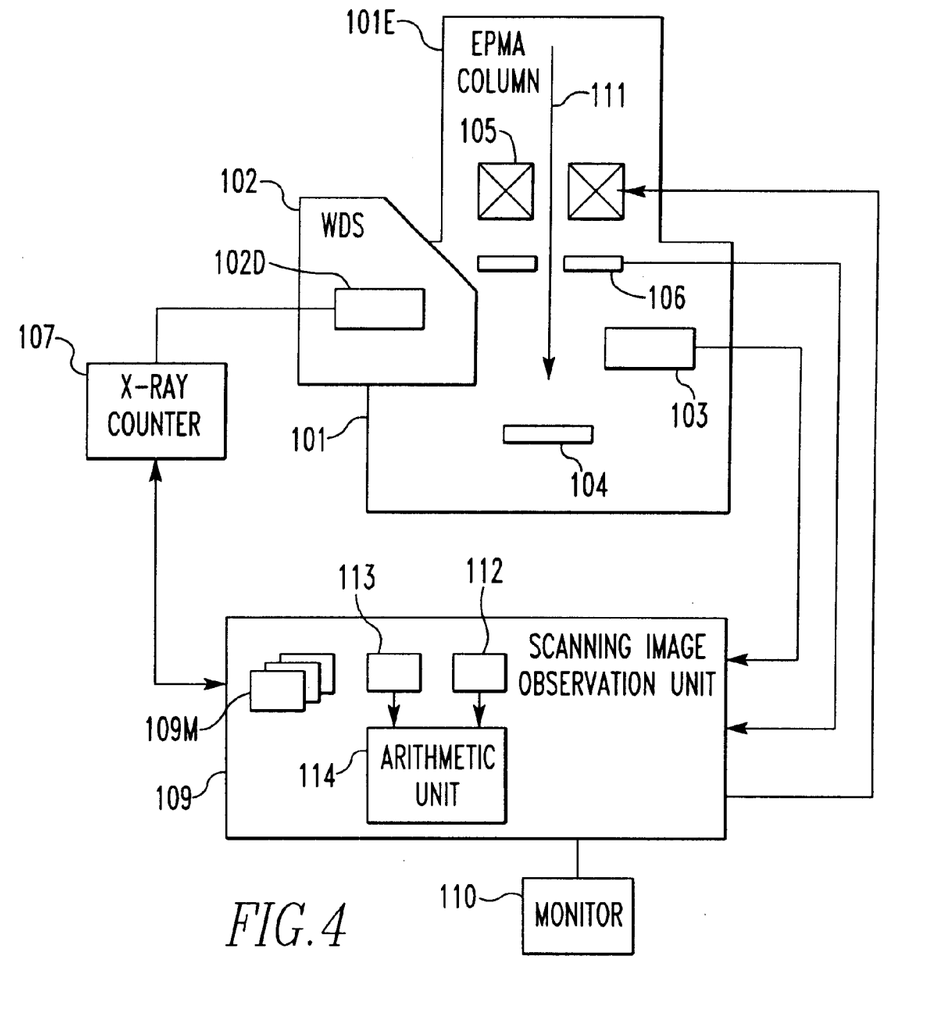
FIG. 4 is a block diagram of an electron probe microanalyzer in accordance with the present invention.

Referring next to FIG. 4, there is shown an electron probe microanalyzer (EPMA) embodying the concept of the invention. This instrument comprises a specimen chamber 101, a microscope column 101E, a wavelength-dispersive x-ray spectrometer (WDS) 102, an x-ray detector 102D, a secondary electron detector 103, an electron beam deflection system 105, a backscattered electron detector 106, for example, of the annular type for obtaining a backscattered electron image, an x-ray counter 107, a scanning image observation unit 109, and a monitor 110. A specimen 104 is placed within the specimen chamber 101. An electron beam 111 is produced within the microscope column 110E. X-ray mapping images are accumulated and stored in memories 109M mounted in the scanning image observation unit 109. The number of the memories 109M is equal to the number of elements measured simultaneously. A reference image is stored in a memory 112. An image to be compared is stored in another memory 113. An arithmetic unit 114 is interfaced to the memories 112 and 113.

The WDS 102, the x-ray detector 102D, the secondary electron detector 103, the backscattered electron detector 106, and the specimen 104 are positioned within the specimen chamber 101. The deflection system 105 is mounted in the microscope column 101E. In addition, an optical microscope (not shown) for imaging the specimen surface by light, a specimen stage (not shown) on which the specimen 104 is placed, and other components (not shown) are mounted in the specimen chamber 101. An electron gun (not shown) and so on are mounted in the microscope column 101E.

The x-ray counter 107 routes an x-ray signal from the x-ray detector 102D to the scanning image observation unit 109 under instructions from the scanning image observation unit 109. The routed x-ray signals are accumulated as x-ray mapping images in the memory 109M during measurements. Furthermore, the observation unit 109 performs various kinds of processing regarding x-ray mapping and displays the results on the monitor 110.

The scanning image observation unit 109 includes a function of scanning the electron beam 111 by controlling the deflection system 105, a function of creating an SE image from the output signal from the secondary electron detector 103 and displaying the image on the monitor 110, a function of displaying a backscattered electron (BSE) image on the monitor 110 after accepting the BSE image from the backscattered electron detector 106, a function of controlling the WDS 102 and x-ray counter 107, a function of performing processing regarding x-ray mapping according to the output signal from the x-ray detector 102D via the x-ray counter 107, a function of storing a reference image and an image to be compared in the memories 112 and 113, respectively, and a function of calculating a cross-correlation function between these images by means of the arithmetic unit 114. The scanning image observation unit 109 can be made of a personal computer or the like and includes input devices, such as a keyboard and a mouse.

X-ray mapping is done in the manner described below. In this case, the operator first causes the scanning image observation unit 109 to display an SE image or BSE image of the specimen 104 on the monitor 110, establishes a region on the specimen 104 within which an x-ray mapping process is to be carried out, and gives an instruction for starting an x-ray mapping process. Where a region on the specimen is established as described above or processing (described later) is performed, the image is an SE image or a BSE image in the same way as in the case of SEM.

On recognizing the instruction for start of the x-ray mapping process, the scanning image observation unit 109 creates a scanning signal for scanning the established region on the specimen 104 and supplies the signal to the deflection system 105. The observation unit 109 instructs the x-ray counter 107 to start an x-ray mapping process.

The electron beam 111 is started to scan the region established on the specimen 104. The x-ray counter 107 accepts the output signal from the x-ray detector 102D and sends it to the scanning image observation unit 109. The scanning image observation unit 109 starts the processing of x-ray mapping, accepts the output signal from the secondary electron detector 103, creates an SE image, and stores it as a reference image in the memory 112.

When a given number of scans are complete, the scan image observation unit 109 accepts the output signal from the secondary electron detector 103 in the next scan, creates an SE image, and stores it as an image to be compared in the memory 113. This image stored in the memory 113 is compared with the reference image in the memory 112. The arithmetic unit 114 calculates the direction and amount of the deviation of the compared image from the reference image by a method similar to the method used in the case of TEM.

The scanning image observation unit 109 finds the direction and amount of the deviation of the compared image from the reference image, using the obtained vector of movement dr. The observation unit 109 generates a deflecting signal to cause the scanned region to move a distance equal to the found amount of deviation in the found direction. The deflecting signal is fed to the deflection system 105. Consequently, the electron beam 111 is deflected in the direction to cancel the vector of movement dr. It follows that the same region is scanned as the region scanned at the beginning of the x-ray mapping process, that is, the specimen drift is corrected.

Whenever a given number of scans are complete, the scanning image observation unit 109 creates an image to be compared, calculates the cross-correlation function between the compared image and the reference image, finds the direction and amount of the deviation of the compared image from the reference image, and corrects the specimen drift based on the found direction and amount of the deviation, until the x-ray mapping process ends.

Figure 5:
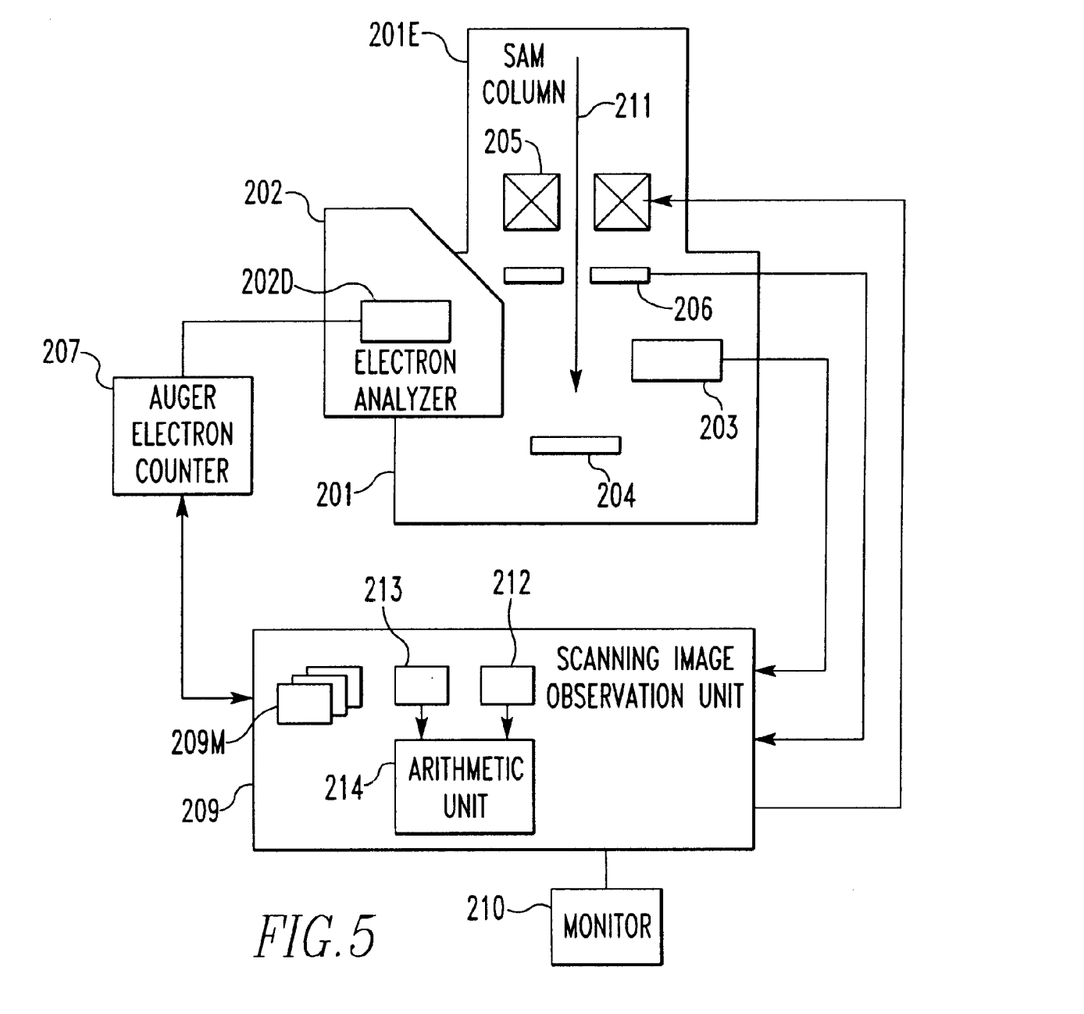
FIG. 5 is a block diagram of a scanning Auger microprobe in accordance with the present invention.

Referring to FIG. 5, there is shown a scanning Auger microprobe (SAM) embodying the concept of the present invention. This instrument comprises a specimen chamber 201, a microscope column 201E, an electron analyzer 202, an Auger electron detector 202D, a secondary electron detector 203, an electron beam deflection system 205, a backscattered electron detector 206, for example, of the annular type, an Auger electron counter 207, a scanning image observation unit 209, and a monitor 210. A specimen 204 is placed within the specimen chamber 201. An electron beam 211 is produced in the microscope column 201E. X-ray mapping images are accumulated and stored in memories 209M included in the scanning image observation unit 209. The number of the memories 209M is equal to the number of elements measured concurrently. A reference image is stored in a memory 212. An image to be compared is stored in another memory 213. These memories 212 and 213 are connected with an arithmetic unit 214.

The electron analyzer 202, the Auger electron detector 202D, the secondary electron detector 203, the backscattered electron detector 206, and the specimen 204 are positioned within the specimen chamber 201. The deflection system 205 is mounted in the microscope column 201E. In addition, a specimen stage (not shown) on which the specimen 204 is placed and other components are mounted in the specimen chamber 201. An electron gun (not shown) and so on are mounted in the microscope column 201E.

The Auger electron counter 207 routes an Auger electron signal from the Auger electron detector 202D to the scanning image observation unit 209 under instructions from the scanning image observation unit 209. The routed Auger electron signals are accumulated as Auger mapping images in the memory 209M during measurements. Furthermore, the observation unit 209 performs various kinds of processing regarding x-ray mapping and displays the results on the monitor 210.

The scanning image observation unit 209 includes a function of scanning the electron beam 211 by controlling the deflection system 205, a function of creating an SE image from the output signal from the secondary electron detector 203 and displaying the image on the monitor 210, a function of displaying a BSE image on the monitor 210 after accepting the BSE image from the backscattered electron detector 206, a function of controlling the electron analyzer 202 and Auger electron counter 207, a function of performing processing regarding Auger electron mapping according to the output signal from the Auger electron detector 202D via the Auger electron counter 207, a function of displaying an Auger electron mapping image on the monitor 210, a function of storing a reference image and an image to be compared in the memories 212 and 213, respectively, and a function of calculating a cross-correlation function between these images by means of the arithmetic unit 214. The scanning image observation unit 209 can be made of a personal computer or the like and includes input devices, such as a keyboard and a mouse.

Auger electron mapping is done in the manner described below. In this case, the operator first causes the scanning image observation unit 209 to display an SE image or BSE image of the specimen 204 on the monitor 210, establishes a region on the specimen 204 within which an Auger electron mapping process is to be carried out, and gives an instruction for starting an Auger electron mapping process. Where a region on the specimen is established as described above or processing (described later) is performed, the image is an SE image or a BSE image in the same way as in the case of SEM, because such an image consists of a much larger amount of signal than Auger electron used for Auger electron mapping and gives sufficiently high contrast. In the description given below, it is assumed that only SE images are employed.

On recognizing the instruction for start of an Auger electron mapping process, the scanning image observation unit 209 creates a scanning signal for scanning the established region on the specimen 204 and supplies the signal to the deflection system 205. The observation unit 209 instructs the Auger electron counter 207 to start an Auger electron mapping process.

The electron beam 211 is started to scan the region established on the specimen 204. The Auger electron counter 207 accepts the output signal from the Auger electron detector 202D and routes it to the scanning image observation unit 209. The observation unit 209 starts processing of Auger electron mapping. In the first scan, the scanning image observation unit 209 accepts the output signal from the secondary electron detector 203, creates an SE image, and stores it as a reference image in the memory 212.

When a given number of scans are complete, the scan image observation unit 209 accepts the output signal from the secondary electron detector 203 in the next scan, creates an SE image, and stores it as an image to be compared in the memory 213. This image stored in the memory 213 is compared with the reference image in the memory 212. The arithmetic unit 214 calculates the direction and amount of the deviation of the compared image from the reference image in the same way as in the case of TEM.

The scanning image observation unit 209 finds the direction and amount of the deviation of the compared image from the reference image, using the obtained vector of movement dr. The observation unit 209 generates a deflecting signal to cause the scanned region to move a distance equal to the found amount of deviation in the found direction. The deflecting signal is fed to the deflection system 205. Consequently, the electron beam 211 is deflected in the direction to cancel the vector of movement dr. It follows that the same region is scanned as the region scanned at the beginning of the Auger electron mapping process. That is, the specimen drift is corrected.

Whenever a given number of scans are complete, the scanning image observation unit 209 creates an image to be compared, calculates a cross-correlation function between the compared image and the reference image, finds the direction and amount of the deviation of the compared image from the reference image, and corrects the specimen drift based on the found direction and amount of the deviation, until the Auger electron mapping process ends.

It has been confirmed that the correction of the specimen drift or beam drift performed as described above permits detection of position shifts at an accuracy of the order of angstroms by making use of the cross-correlation function provided that the performance of the present TEM is employed. Therefore, if the number of scans made until the next image to be compared is obtained and the scan time of each scan is set appropriately in the processing for correction of the specimen drift, a spatial resolution on the order of angstroms is sufficiently assured in x-ray mapping. Furthermore, in an SEM or a similar instrument, a submicron spatial resolution is assured. In Auger electron mapping using a scanning Auger microprobe (SAM), a spatial resolution on the order of 100 angstroms is assured.

As described thus far, in the TEM/SEM instrument and similar instruments, specimen drift is automatically corrected whenever a given number of scans are made. Therefore, the burden imposed on the operator can be reduced greatly compared with the prior art technique. Furthermore, the spatial resolution that would normally be deteriorated by specimen drift can be prevented from decreasing. In addition, the electron beam can be scanned continuously for a long time and so blur-free, x-ray mapping images with high contrast can be obtained. In SAM, blur-free, Auger electron mapping images with high contrast can be derived.

While the preferred embodiments of the present invention have been described thus far, it is to be understood that the present invention is not limited thereto and that various changes and modifications are possible. For example, in the embodiments described above, the scanning image observation unit performs processing for correction of specimen drift, based on the calculation of the cross-correlation function and on the resulting vector of movement dr. Of course, an instrument using an EDS can perform such correction by an x-ray analysis processor. In this case, however, it is necessary to route the reference image created by the scanning image observation unit and the image to be compared to the x-ray analysis processor. In addition, in the description provided above, an SE image is used in calculating the cross-correlation function. As mentioned above, an STEM image may be used in TEM. A backscattered electron image may be used in SEM and similar apparatus.

Having thus described my invention with the detail and particularity required by the Patent Laws, what is desired protected by Letters Patent is set forth in the following claims.

What is claimed is:

1. An electron microscope having a scanning beam for irradiating a desired region on a specimen with a focused electron beam while scanning the beam in two dimensions, for detecting a first signal from the irradiated region, and for obtaining a first two-dimensional image based on the first signal, said electron microscope comprising:

a first detector for detecting said first signal and means for repeating said scan and, at the same time, accumulating said first signal to perform a sequence of measurements for obtaining said first two-dimensional image;

a second detector for detecting a second signal from said desired region at spaced intervals during the time period in which said sequence of measurements for obtaining said first two-dimensional image are gathered, said second signal being different from said first signal;

means for obtaining a second two-dimensional image based on said second signal at the beginning of said sequence of measurements and storing said second two-dimensional image as a reference image;

automatic means (i) for repeatedly at spaced intervals causing the second detector to obtain a second two-dimensional image based on said second signal as said sequence of measurements progresses and for storing the second two-dimensional image obtained as an image to be compared and (ii) for comparing said second two-dimensional image with said reference image and finding the direction and amount of the displacement of said second image from said reference image successively during the time period in which said sequence of measurements for obtaining said first two-dimensional image are gathered; and means for repeatedly modifying the region scanned with said electron beam according to the found direction and amount of displacement.

2. An electron microscope as set forth in claim 1, wherein said first signal is indicative of x-rays emitted in response to the irradiating electron beam.

3. An electron microscope as set forth in claim 1, wherein said first signal is indicative of Auger electrons emitted in response to the irradiating electron beam.

4. An electron microscope as set forth in claim 1, wherein said electron microscope is a transmission electron microscope, and wherein said first signal is indicative of x-rays emitted in response to the irradiating electron beam.

5. An electron microscope as set forth in claim 1, wherein said electron microscope is a scanning electron microscope, and wherein said first signal is indicative of x-rays emitted in response to the irradiating electron beam.

6. An electron microscope as set forth in claim 1, wherein said electron microscope is an electron probe microanalyzer, and wherein said first signal is indicative of x-rays emitted in response to the irradiating electron beam.

7. An electron microscope as set forth in claim 1, wherein said electron microscope is a scanning Auger microprobe, and wherein said first signal is indicative of Auger electrons emitted in response to the irradiating electron beam.

* * * * *

UNITED STATES PATENT AND TRADEMARK OFFICE
CERTIFICATE OF CORRECTION

PATENT NO. : 6,448,555 B1
DATED : September 10, 2002
INVENTOR(S) : Fumio Hosokawa It is certified that error appears in the above-identified patent and that said Letters Patent is hereby corrected as shown below:

<u>Title page,</u>
Item [73], Assignee, "Jeol Ltd." should read -- JEOL Ltd. --
Item [30], Foreign Application Priority Data, insert -- July 29, 1998 JP 10-214290 --.

Signed and Sealed this

Eighteenth Day of February, 2003

JAMES E. ROGAN
*Director of the United States Patent and Trademark Office*